United States Patent
Brunnbauer

(10) Patent No.: US 7,592,689 B2
(45) Date of Patent: Sep. 22, 2009

(54) SEMICONDUCTOR MODULE COMPRISING SEMICONDUCTOR CHIPS AND METHOD FOR PRODUCING THE SAME

(75) Inventor: Markus Brunnbauer, Lappersdorf (DE)

(73) Assignee: Infineon Technologies AG, Neubiberg (DE)

(*) Notice: Subject to any disclaimer, the term of this patent is extended or adjusted under 35 U.S.C. 154(b) by 23 days.

(21) Appl. No.: 11/622,773

(22) Filed: Jan. 12, 2007

(65) Prior Publication Data

US 2007/0164418 A1 Jul. 19, 2007

(30) Foreign Application Priority Data

Jan. 12, 2006 (DE) .................. 10 2006 001 767

(51) Int. Cl.
*H01L 23/02* (2006.01)
(52) U.S. Cl. .................. 257/685; 257/723; 257/724; 257/778; 257/786; 257/E23.18; 257/686
(58) Field of Classification Search .......... 257/723, 257/724, 778, 786, 685, E23.18, 676; 438/107, 438/108

See application file for complete search history.

(56) References Cited

U.S. PATENT DOCUMENTS

| | | | | |
|---|---|---|---|---|
| 5,353,498 | A * | 10/1994 | Fillion et al. ............ | 29/840 |
| 5,977,640 | A | 11/1999 | Bertin et al. | |
| 6,583,502 | B2 * | 6/2003 | Lee et al. ................ | 257/686 |
| 6,611,063 | B1 * | 8/2003 | Ichinose et al. ........ | 257/784 |
| 6,617,695 | B1 * | 9/2003 | Kasatani ................. | 257/778 |
| 6,680,529 | B2 * | 1/2004 | Chen et al. ............. | 257/700 |
| 6,844,619 | B2 | 1/2005 | Tago | |
| 7,235,885 | B2 * | 6/2007 | Horii ...................... | 257/777 |
| 7,335,987 | B2 * | 2/2008 | Huang .................... | 257/734 |
| 7,378,733 | B1 * | 5/2008 | Hoang et al. ........... | 257/724 |
| 2002/0074653 | A1 * | 6/2002 | Khandros et al. ...... | 257/724 |
| 2003/0198034 | A1 | 10/2003 | Pu | |
| 2003/0215993 | A1 | 11/2003 | Oshima | |
| 2006/0006516 | A1 * | 1/2006 | Funaba et al. ......... | 257/686 |
| 2006/0060954 | A1 | 3/2006 | Meyer-Berg | |
| 2006/0278972 | A1 * | 12/2006 | Bauer et al. ........... | 257/701 |
| 2007/0246837 | A1 * | 10/2007 | Dong .................... | 257/778 |

FOREIGN PATENT DOCUMENTS

| | | |
|---|---|---|
| DE | 42222402 A1 | 1/1994 |
| DE | 10142116 A1 | 11/2002 |
| JP | 60080232 | 5/1985 |

* cited by examiner

*Primary Examiner*—Alexander G Ghyka
*Assistant Examiner*—Angel Roman
(74) *Attorney, Agent, or Firm*—Edell, Shapiro & Finnan, LLC

(57) ABSTRACT

A semiconductor module includes: a plastic housing composition; at least one semiconductor chip with an active top side, a coplanar underside of the semiconductor module including the active top side of the semiconductor chip(s) and a surface of the plastic housing composition; a wiring structure arranged on the coplanar underside, the wiring structure including a center region and edge regions, with external contact areas distributed uniformly in the center region; external contacts arranged on the external contact areas of the wiring structure; and at least one surface-mountable semiconductor component arranged on the wiring structure in at least one of the edge regions, the surface-mountable semiconductor component(s) having a structural height that is less than the height of the external contacts.

11 Claims, 4 Drawing Sheets

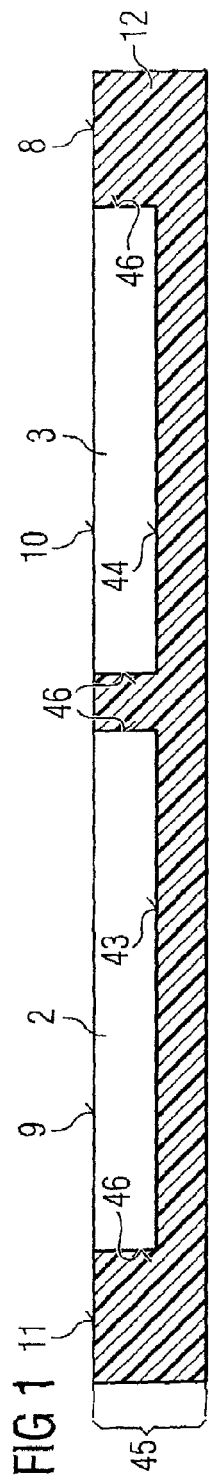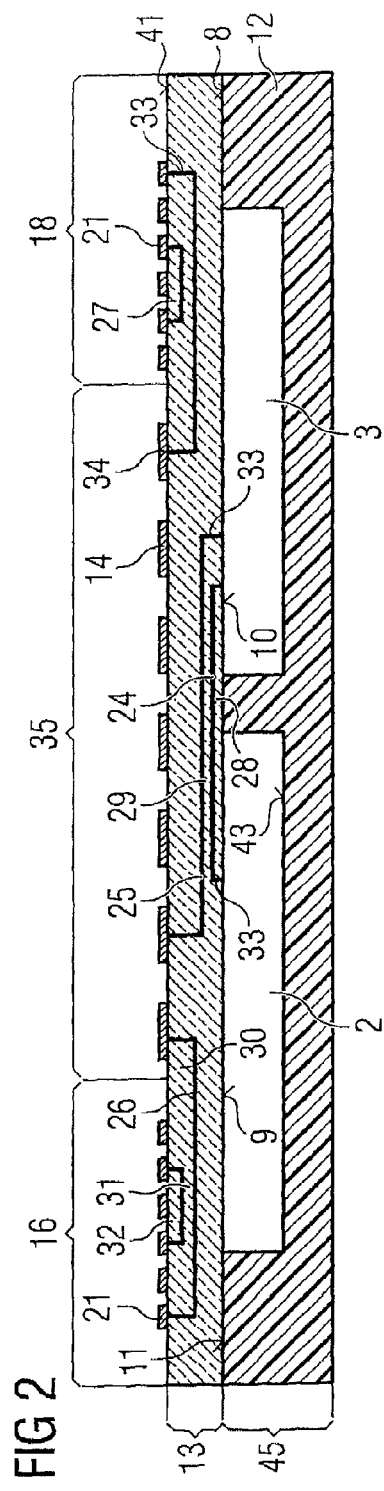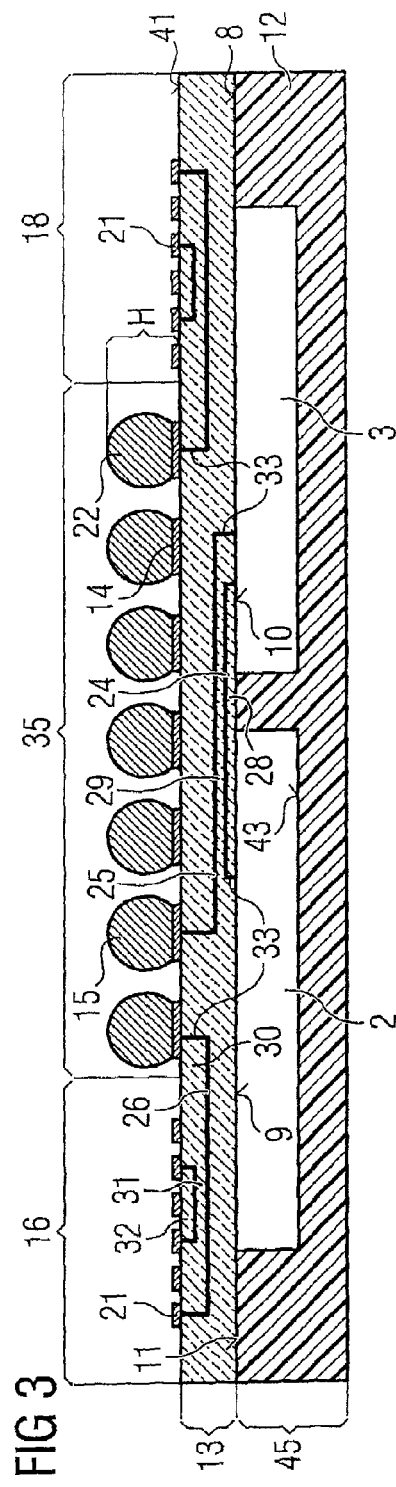

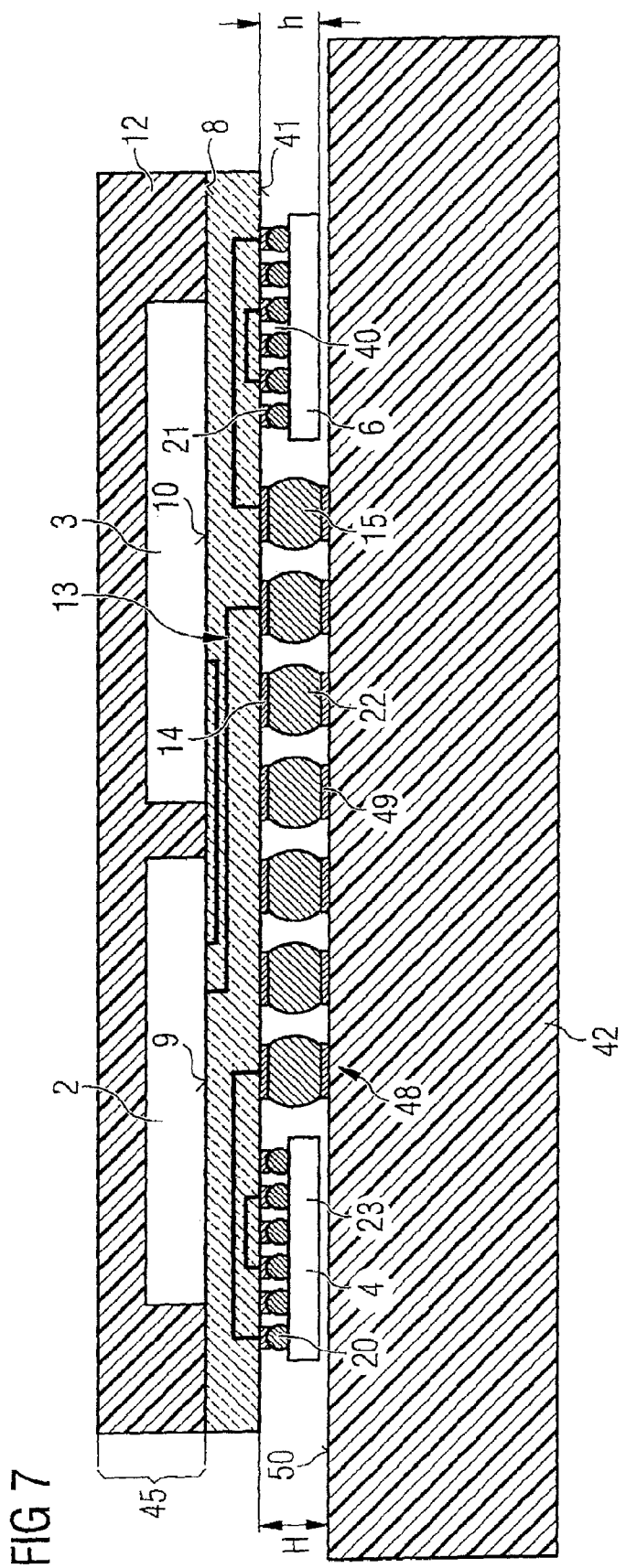

SEMICONDUCTOR MODULE COMPRISING SEMICONDUCTOR CHIPS AND METHOD FOR PRODUCING THE SAME

CROSS REFERENCE TO RELATED APPLICATIONS

This application claims priority under 35 U.S.C. §119 to Application No. DE 102006001767.6 filed on Jan. 12, 2006, entitled "Semiconductor Module Comprising Semiconductor Chips and Method for Producing the Same," the entire contents of which are hereby incorporated by reference.

BACKGROUND

A semiconductor module can be constructed in a plastic housing composition in a manner known by the catchword "universal package." The "universal package" has the advantage that a composite body composed of semiconductor chips and plastic housing composition is created which is characterized by a coplanar area composed of active top sides of semiconductor chips and the top side of a plastic housing composition, the edge regions and the rear sides of the respective semiconductor chips being embedded in plastic housing composition.

A "universal package" of this type has the advantage that a multilayer wiring structure can be applied on the coplanar surface in order to connect the electrodes of the semiconductor elements of the embedded semiconductor chips among one another and to external contact areas of corresponding size, on which surface-mountable external contacts can then be positioned or soldered. In the case of semiconductor power modules of this type, the problem arises that, depending on how many semiconductor chips are combined to form a semiconductor module, the number of external contact areas can rise to an arbitrary magnitude. However, the larger the number of external contacts, the more difficult it becomes to arrange the external contacts on a superordinate circuit board and to electrically connect them reliably to corresponding contact pads on the circuit board. Accordingly, there is a need to reduce the number of surface-mountable external contacts to be connected to a necessary amount.

A known semiconductor module having a first semiconductor chip comprising an active top side and an inactive rear side, the active top side being divided at least into a first connection region and into a second connection region. The semiconductor chip module furthermore has a second semiconductor chip, which has an active top side and an inactive rear side and is connected on the second connection region of the first semiconductor chip via flip-chip contacts. Finally, the semiconductor module has a substrate having a top side and an underside, the top side being provided for mounting the first connecting region of the first semiconductor chip thereon via flip-chip contacts. For this purpose, the substrate has a predetermined height that is greater than the thickness of the second semiconductor chip. Finally, the semiconductor module has a printed superordinate circuit for mounting the substrate with the aid of surface mounting.

In the case of this known semiconductor module it is possible to reduce the external connections by semiconductor chips which are arranged in edge regions of the first semiconductor chip, but the thickness of the additional semiconductor chips is so great that the height of surface-mountable external contacts in the center of the first semiconductor chip does not suffice for mounting them on a superordinate circuit board. Rather, the known semiconductor module provides for lengthening or enlarging these central surface-mountable external contacts of the first semiconductor chip by means of an intermediate substrate in such a way that the semiconductor module can be mounted on a superordinate circuit board with the aid of the intermediate substrate.

This solution has the disadvantage that a uniform solder ball size is provided both for the first semiconductor substrate, which carries additional semiconductor chips with flip-chip contacts on its underside, and for the external contacts of the first semiconductor chip. It is thus impossible for the additional substrate to be able to be dispensed with and for the external contacts situated in the center to suffice for bridging the height or thickness of the second flip-chip-mounted semiconductor devices.

SUMMARY

The invention provides a semiconductor module which is as cost-effective as possible and which makes it possible on the one hand to connect as many semiconductor chips as desired in a common plastic housing composition and to equip the resulting external contact areas for supply and for signal connection with a correspondingly optimized wiring structure, in which case the number of external contact areas is to be reduced to an optimum number.

The semiconductor module can comprise: a plastic housing composition; at least one semiconductor chip with an active top side, the semiconductor module including a coplanar underside that includes the active top side of the semiconductor chip(s) and a surface of the plastic housing composition; a wiring structure arranged on the coplanar underside, the wiring structure having a center region and edge regions and including external contact areas distributed uniformly in the center region; external contacts arranged on the external contact areas of the wiring structure; and at least one surface-mountable semiconductor component arranged on the wiring structure in at least one of the edge regions, the surface-mountable semiconductor component(s) having a structural height that is less than the height of the external contacts.

The above and still further features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention will now be explained in more detail with reference to the accompanying figures.

FIGS. 1 to 5 show schematic cross sections through components during the production of a semiconductor module in accordance with one embodiment of the invention.

FIG. 1 shows a schematic cross section through a composite body with a coplanar area composed of semiconductor chips and plastic housing composition.

FIG. 2 shows a schematic cross section through the composite body in accordance with FIG. 1 after the application of a wiring structure to the coplanar area.

FIG. 3 shows a schematic cross section through the composite body in accordance with FIG. 2 after the application of external contacts to the wiring structure.

FIG. 4 shows a schematic cross section through the composite body in accordance with FIG. 3 with aligned semiconductor components over edge regions of the wiring structure.

FIG. 5 shows a schematic cross section through a semiconductor module in accordance with one embodiment of the invention.

FIG. 7 shows a schematic cross section through the semiconductor module in accordance with FIG. 5 after the application of the module to a superordinate circuit board.

DETAILED DESCRIPTION

Figure 4:
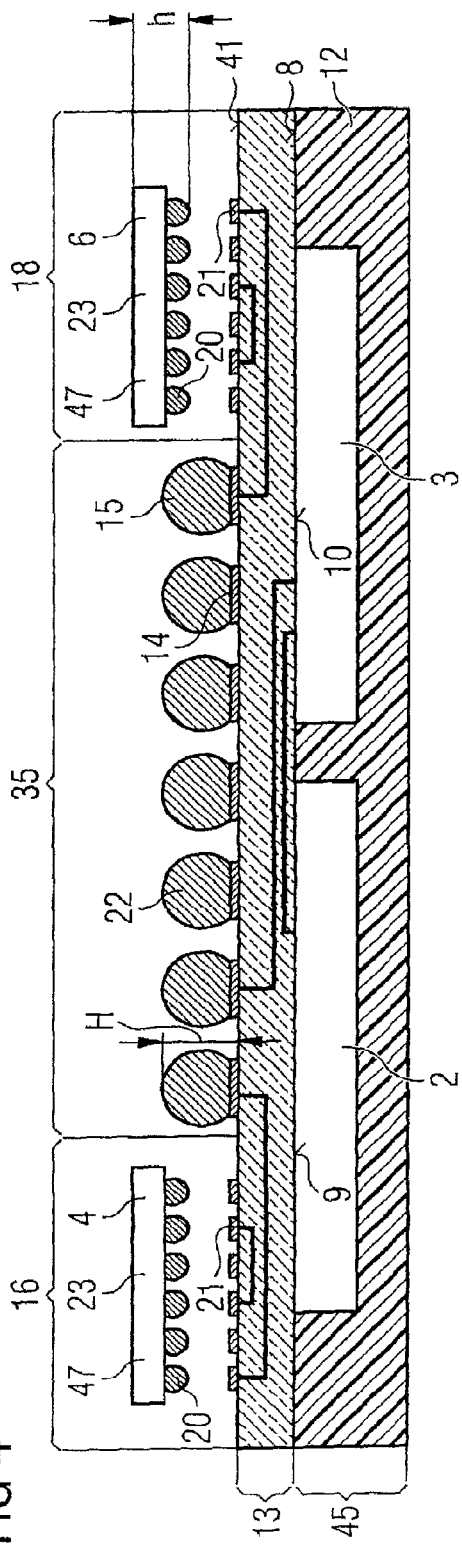

The invention provides a semiconductor module comprising semiconductor chips, the semiconductor module having a coplanar underside. The coplanar underside comprises active top sides of at least one semiconductor chip and a top side of a plastic housing composition. There is arranged on the coplanar underside a wiring structure having external contact areas distributed uniformly in the center. External contacts are arranged on the external contact areas, there being arranged on the edge regions of the coplanar underside at least one surface-mountable semiconductor component having a structural height that is less than the height of the external contacts of the semiconductor module.

This semiconductor module has the advantage that distance-bridging intermediate substrates, as required in the prior art, can be dispensed with. The costs for an intermediate substrate of this type can thus be saved. Furthermore, this semiconductor module has the advantage that it utilizes the extraordinary advantages of the "universal package method" in order to make available a correspondingly coplanar area on which further semiconductor chips with flip-chip contacts can be connected, and on which it is possible to provide a sufficient number of external contacts for mounting on a superordinate circuit board.

The fitting of at least one additional semiconductor component with flip-chip contacts on the coplanar underside of the semiconductor module in conjunction with the wiring structure advantageously makes it possible to limit the external contact areas to a minimum. Furthermore, as a result of the difference in size between flip-chip contacts and external contacts for the semiconductor module, a device is created which can be surface-mounted by the central external contacts directly on a superordinate circuit board without an intermediate substrate.

In one exemplary embodiment of the invention, the wiring structure is optimized such that, in the interaction of the surface-mounted semiconductor component with the semiconductor chip of the coplanar area, the center has a minimized number of external contacts. This is associated with the advantage that the semiconductor module can be reliably mounted on a superordinate circuit board with the aid of the external contacts situated in the center.

It is furthermore provided that surface-mountable semiconductor components are arranged in the edge region of the coplanar underside and have semiconductor chips with flip-chip contacts. These have the advantage that the flip-chip contacts have a smaller structural height than the external contacts of the semiconductor module. Consequently, the dimensions of the external contacts can be balanced with respect to the dimensions of the flip-chip contacts such that the semiconductor components in the edge regions of the coplanar area constitute a spacer arrangement.

In a further exemplary embodiment of the invention, the wiring structure has, in the edge region of the coplanar underside of the semiconductor module, contact pads in a pattern corresponding to the arrangement of surface-mountable contacts of the surface-mountable semiconductor component. This embodiment of the invention already prepares for the wiring structure on the coplanar underside to be configured such that the flip-chip contacts of the surface-mountable semiconductor components can be soldered on directly.

It is furthermore provided that conductor tracks are arranged on the coplanar underside between the contact pads on the coplanar underside of the semiconductor module and the external contact areas. The conductor tracks provide for signal exchange between the surface-mountable semiconductor components and the semiconductor chips in the region of the "universal package." The conductor tracks permit the external contacts of the semiconductor module to be reduced and optimized.

It is furthermore provided that the external contacts of the semiconductor module that are arranged in the center of the coplanar area are solder balls. Solder balls have the advantage that they are available with different diameters, so that it can be ensured that the height of the external contacts in the center of the coplanar area is greater than the thickness of the surface-mountable semiconductor devices in the edge regions of the coplanar area. Furthermore, in order to ensure this height difference, in a further embodiment of the invention, the semiconductor chip of the surface-mountable semiconductor component may be thinned. By thinning such semiconductor chips for the surface-mountable semiconductor components, the device height can practically be halved, which in turn makes it possible to provide smaller solder balls for the external contacts in the center of the coplanar area.

Furthermore, provision can be made for equipping the wiring structure on the coplanar underside of the semiconductor module with a plurality of structured metal layers and insulation layers arranged in between, the metal layers being electrically interconnected via through contacts through the insulation layers. A multilayer wiring of this type is associated with the advantage that the areal extent of the coplanar underside of the semiconductor module can be reduced.

In one specific embodiment of the invention, the semiconductor module has two semiconductor chips on the coplanar underside, on which is arranged a wiring structure having external contact areas distributed uniformly in the center, external contacts being arranged on the external contact areas, and a respective surface-mountable semiconductor component being arranged in the four corner regions of the coplanar underside. This division of the coplanar area into a central region with external contacts and with four surface-mountable semiconductor components at the four corners has thermal advantages since the surface-mountable semiconductor components arranged in the corner regions can be intensively cooled.

Provision is furthermore made for filling an interspace between the coplanar underside and the surface-mountable semiconductor components with an underfill material. This embodiment of the invention has the advantage that a higher temperature resistance is achieved for the semiconductor module, especially as the underfill material improves the thermal stability of the semiconductor module.

A method for producing a plurality of semiconductor modules comprising semiconductor chips includes the following operations. A composite body is produced for a plurality of semiconductor modules in semiconductor module positions of the composite body. In this case, semiconductor chips are arranged in a plastic housing composition such that the active top sides of the semiconductor chips and the top side of the plastic housing composition form a coplanar area. The coplanar area is provided in the case of the composite body for the coplanar undersides of the semiconductor modules in the semiconductor module positions.

After a composite body of this type has been produced, a wiring structure is applied to the coplanar area with external contact areas in the center of the semiconductor module positions and contact pads in edge regions of the semiconductor module positions. The edge region of the semiconductor module positions is subsequently populated with surface-mountable semiconductor components, the surface-mountable contacts thereof being electrically connected to the contact pads of the coplanar undersides in the individual semiconductor module positions. Afterward, external contacts are applied on the external contact areas in the center of the coplanar area and, finally, the composite body can be separated into individual semiconductor modules.

This method has the advantage that a plurality of semiconductor modules can be produced in parallel, a board-type, self-supporting composite body being created which can be populated like a circuit board with the surface-mountable semi-conductor components in the edge regions of each of the semiconductor module positions.

In one exemplary implementation of the method, as surface-mountable semiconductor components, semiconductor chips with flip-chip contacts are fixed in the edge regions of the semiconductor module positions on the wiring structure of the coplanar area. Semiconductor components reduced to semiconductor chips in this way have the advantage that they take up a small space requirement on the semiconductor module.

Furthermore, interspaces between the semiconductor component with surface-mountable contacts and the top side of the wiring structure are filled with an underfill material.

This filling is effected in capillary fashion by permitting a tool with corresponding low-viscosity, non-cured and uncrosslinked epoxy resin to penetrate into the interspaces via the edge sides of the semiconductor components. Finally, a further exemplary embodiment of the method provides for the semiconductor chips of the surface-mountable semiconductor components to be thinned before they are applied to the coplanar area.

This method variant has the advantage that, in a manner corresponding to the thinned semiconductor chips for the surface-mountable semiconductor components, it is also possible to reduce the height of the external contacts, thereby enabling a longer step size or a smaller pitch for the external contacts of the semiconductor module in the center of the coplanar area. Finally, the wiring structure can be applied photolithographically to the coplanar area of the composite body in multilayer fashion via correspondingly provided metal and insulation masks. In this case, through contacts are simultaneously created between the individual metallization planes, so that an optimum electrical connection can arise between the surface-mountable semiconductor components arranged in the edge regions and the central external contact areas.

Besides the advantage of a compact mode of production of semiconductor modules with the aid of the "universal package" method, it has been shown that such semi-conductor modules have an improved thermal behavior since the heat can be dissipated in an accelerated manner. In this case, the flip-chip mounting of surface-mountable semiconductor devices in the edge regions of the coplanar area supports these advantages of heat loss dissipation. It can furthermore be stated that, with two or more chips which are combined in a common plastic housing composition in the module, an optimum interconnection of these embedded semiconductor chips is possible via a photolithographically applied wiring structure.

By this electrical connection between the individual semiconductor chips in the plastic housing composition, the number of external connections required for soldering onto a superordinate circuit board can be reduced to the greatest possible extent, especially as it is possible for the semiconductor chips also to be interconnected via the rewiring structure. Moreover, the rewiring structure is used to realize the contact-connection of the semiconductor chips in the plastic housing composition with the flip-chip contacts of the surface-mountable semiconductor components in the edge regions of the coplanar area. In this case, the free areas are utilized for a reduction of the external connections advantageously on the underside of the semiconductor module.

Exemplary embodiments of the invention are now described in connection with the accompanying drawings. FIG. 1 shows a schematic cross section through a composite body 45 with a coplanar area 8 composed of semiconductor chips 2 and 3 and a plastic housing composition 12. The coplanar area 8 forms the coplanar underside 8 for an individual semiconductor module, a wiring structure subsequently being applied to the underside. The active top sides 9 and 10 of the semiconductor chips 2 and 3 together with the top side 11 of the plastic housing composition form the coplanar area 8. The rear sides 43 and 44 of the semiconductor chips 2 and 3 and also the edge sides 46 thereof are completely embedded into the plastic housing composition 12. A composite body 45 of this type is dimensionally stable and self-supporting and can be provided with a wiring structure after its completion.

FIG. 2 shows a schematic cross section through the composite body 45 in accordance with FIG. 1 after the application of a wiring structure 13 to the coplanar area 8. The wiring structure 13 has metal layers 24, 25, 26, 27 and 34 and also insulation layers 28 to 32 arranged in between. For this purpose, firstly the bottommost insulation layer 28 is deposited on the coplanar area 8 and, after passage openings have been opened, a structured metal layer 24 is deposited onto the insulation layer, the metal layer connecting for example electrodes of the semiconductor chips 2 and 3 among one another via conductor tracks and through contacts 33.

A further insulation layer 29 is subsequently deposited on the first metal layer 24 and passage windows are once again opened in order, by way of example, to uncover electrodes of the semiconductor chips 2 and/or 3. A second metal layer 25 is then deposited on the second insulation layer 27, which second metal layer is intended to connect in preparatory fashion, by way of example, electrodes of the semiconductor chips 2 and 3 to corresponding planned external contact areas on the topmost metal layer 34 of the wiring structure 13. An insulation layer 30 is once again applied over the second metal layer 25, and a structured metal layer 26 is positioned on the insulation layer, which structured metal layer is intended to connect, by way of example, external contact areas 14 in the center 35 to contact pads 21 in the edge regions 16 and/or 18.

Finally, a further insulation layer 31 is once again deposited on the third metal layer 26 and then a further structured metal layer 27 is deposited on the further insulation layer, which further structured metal layer may electrically interconnect contact pads, by way of example. Lastly, an insulation layer 32 is applied, on which an upper metal layer 34 is then deposited, which has external contact areas 14 in the center 35 of the wiring structure 13 and forms contact areas 21 in the edge regions 16 and 18. The contact areas 21 correspond in terms of their arrangement to the surface-mountable contacts of a semiconductor component, while the external contact areas 14 are adapted in terms of size and arrangement to the planned external contacts in the center 35 of the semiconductor module.

FIG. 3 shows a schematic cross section through the composite body 45 in accordance with FIG. 2 after the application of external contacts 15 in the form of solder balls 22 to the wiring structure 13. The structuring of the upper metal layer is utilized in the center 35 for soldering the external contacts 22 onto the external contact areas 14, while in the edge regions 16 and 18 the contact pads 21 prepared for surface-mountable semiconductor components are initially left unpopulated. In order to interconnect the individual metal layers 24 to 27 and 34 through the insulation layers 28 to 32, through contacts 33 are provided in the wiring structure 13.

FIG. 4 shows a schematic cross section through the composite body 45 in accordance with FIG. 3 with aligned semiconductor components 4 and 6 over edge regions 16 and 18 of the wiring structure 13. For this purpose, the semiconductor components 4 and 6 have semiconductor chips 23 aligned with their flip-chip contacts 20 over the contact pads 21 in the edge regions 16 and 18 of the wiring structure 13. Preferably thinned semiconductor chips 47 may be provided as semiconductor chips 23.

Figure 5:
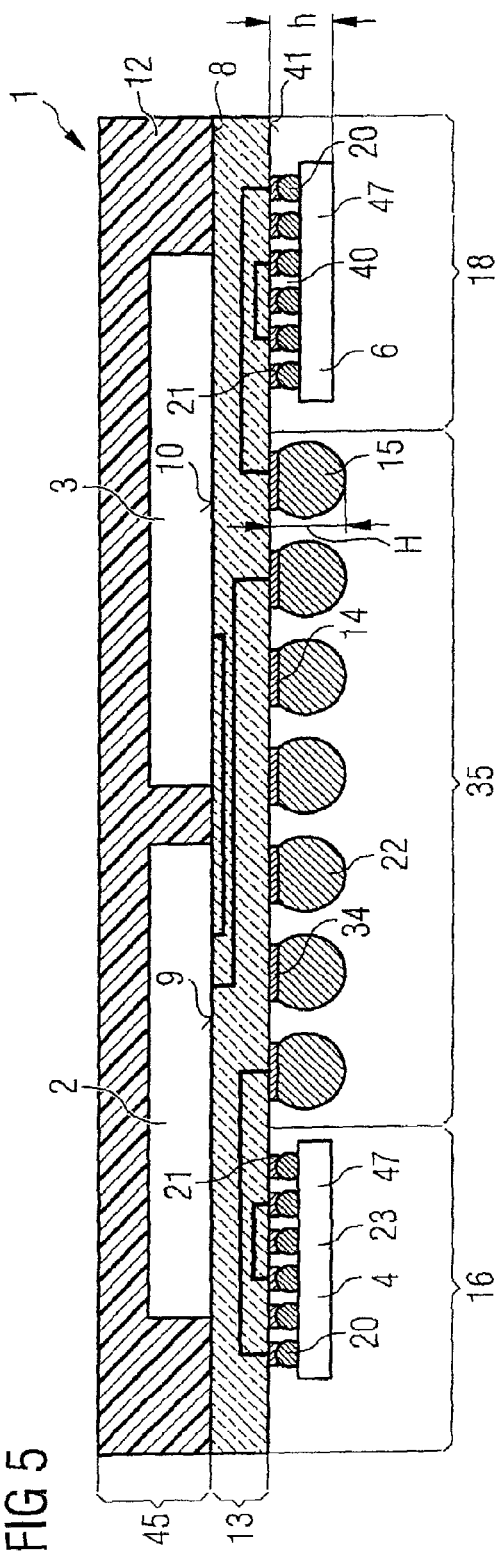

FIG. 5 shows a schematic cross section through a semiconductor module 1 in accordance with one embodiment of the invention. In this respect, the semiconductor components 4 and 6 are arranged and fixed with their flip-chip contacts 20 on the contact pads 21 of the upper metallization layer 34, the structural height h of the semiconductor components 4 and 6 being less than the height H of the external contacts 15 in the form of solder balls 22.

Figure 6:
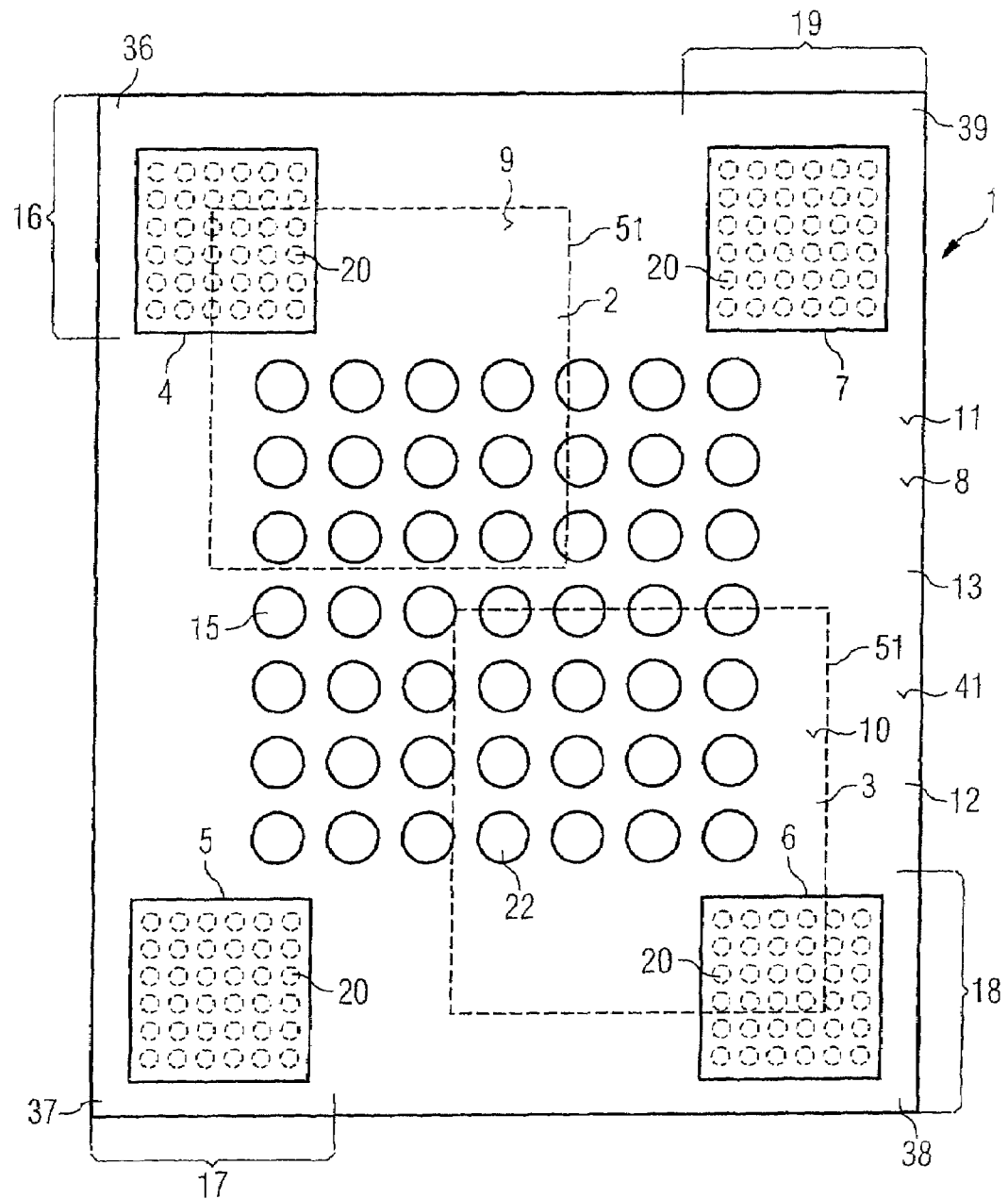
FIG. 6 shows a schematic bottom view of the semiconductor module in accordance with FIG. 5.

FIG. 6 shows a schematic bottom view of the semiconductor module 1 in accordance with FIG. 5. In this embodiment of the invention, the semiconductor components 4, 5, 6 and 7 are arranged with their flip-chip contacts 20 in corner regions 36, 37, 38 and 39 of the edge regions 16 to 19 of the wiring structure on corresponding contact pads. The heat loss dissipation is relatively high as a result of the positioning of the semiconductor components 4 to 7 in the corner regions 36 to 39. Dashed lines 51 are used in this illustration to illustrate the position of the two semiconductor chips 4 and 5 which are embedded into the plastic housing composition 12. Dashed lines are likewise used to identify the contact pads for receiving the flip-chip contacts of the semiconductor components 4, 5, 6 and 7.

FIG. 7 shows a schematic cross section through the semiconductor module 1 in accordance with FIG. 5 after the application of the module to a superordinate circuit board 42. For this purpose, the circuit board 42 has a wiring structure 48 with contact pads 49 on its top side 50. The external contacts 15 of the semiconductor module 1 are soldered onto the contact pads 49 on the top side 50 in order to produce a connection to the wiring structure 48 of the superordinate circuit board 42. In this case, the structural height h of the semiconductor components 4 and 6 may be dimensioned such that the semiconductor components 4 and 6 may serve as spacers when the external contacts 15 of the semiconductor module 1 are soldered onto the circuit board 42.

Moreover, it may be provided that the interspace 40 between the surface-mountable semiconductor components 4 and 6 and the wiring structure 13 is filled with an underfill material.

Having described exemplary embodiments of the invention, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

What is claimed is:

1. A semiconductor module, comprising:
   a composite body including a plastic housing composition and at least one semiconductor chip with an active top side, a coplanar underside of the composite body including the active top side of the at least one semiconductor chip and a surface of the plastic housing composition;
   a wiring structure arranged on the coplanar underside, the wiring structure including a center region and edge regions, with external contact areas distributed in the center region;
   external contacts arranged on the external contact areas of the wiring structure, the external contact extending to a height from the wiring structure; and
   at least one surface-mountable semiconductor component arranged on the wiring structure in at least one of the edge regions, the at least one surface-mountable semiconductor component having a structural height that is less than the height of the external contacts.

2. The semiconductor module as claimed in claim 1, wherein the wiring structure is configured such that a minimum number of external contacts are required for interaction between the at least one surface-mountable semiconductor component and the at least one semiconductor chip.

3. The semiconductor module as claimed in claim 2, wherein the at least one surface-mountable semiconductor component comprises a semiconductor chip with flip-chip contacts.

4. The semiconductor module as claimed in claim 3, wherein the semiconductor chip of the at least one surface-mountable semiconductor component is thinned.

5. The semiconductor module as claimed in claim 1, wherein the wiring structure includes contact pads in the edge regions, the contact pads being arranged in a pattern corresponding to an arrangement of surface-mountable contacts of the at least one surface-mountable semiconductor component.

6. The semiconductor module as claimed in claim 5, wherein the wiring structure includes conductor tracks between the contact pads and the external contact areas.

7. The semiconductor module as claimed in claim 1, wherein the external contacts of the semiconductor module comprise solder balls.

8. The semiconductor module as claimed in claim 1, wherein the wiring structure includes a plurality of structured metal layers and insulation layers arranged between the metal layers, the metal layers being electrically interconnected via through contacts through the insulation layers.

9. The semiconductor module as claimed in claim 1, wherein:
   the at least one semiconductor chip comprises two semiconductor chips arranged along the center region of the wiring structure; and
   the at least one surface-mountable semiconductor component comprises four surface-mountable semiconductor components respectively arranged in the four corner regions of the wiring structure.

10. The semiconductor module as claimed in claim 9, further comprising an underfill material that fills an interspace between the coplanar underside and the surface-mountable semiconductor components.

11. The semiconductor module as claimed in claim 1, wherein rear and edge sides of the at least one semiconductor chip are completely embedded in the plastic housing composition.

* * * * *